(12) United States Patent
Jin et al.

(10) Patent No.: US 9,978,134 B2
(45) Date of Patent: May 22, 2018

(54) SAMPLING METHOD AND APPARATUS APPLIED TO OPC OF LITHOGRAPHY LAYOUT

(71) Applicant: Shanghai Huahong Grace Semiconductor Manufacturing Corporation, Shanghai (CN)

(72) Inventors: Xiaoliang Jin, Shanghai (CN); Chunyu Yuan, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 8 days.

(21) Appl. No.: 15/388,565

(22) Filed: Dec. 22, 2016

(65) Prior Publication Data

US 2018/0082418 A1 Mar. 22, 2018

(30) Foreign Application Priority Data

Sep. 22, 2016 (CN) .......................... 2016 1 0843995

(51) Int. Cl.
*G06K 9/00* (2006.01)
*G06T 7/00* (2017.01)
*G06K 9/46* (2006.01)

(52) U.S. Cl.
CPC .......... *G06T 7/0004* (2013.01); *G06K 9/4671* (2013.01); *G06T 2207/30148* (2013.01)

(58) Field of Classification Search
None
See application file for complete search history.

(56) References Cited

U.S. PATENT DOCUMENTS 6,492,066 B1 * 12/2002 Capodieci ................. G03F 1/36
430/5
7,171,037 B2 * 1/2007 Mahon ............. G01N 21/95684
382/145

(Continued)

FOREIGN PATENT DOCUMENTS

CN 1940715 A 4/2007
CN 102955363 A 3/2013
(Continued)

OTHER PUBLICATIONS

Application of an effective wavelet—masks, Seung-Gol Lee et al., SPIE, 2000, pp. 723-733.*
(Continued)

*Primary Examiner* — Jayesh A Patel
(74) *Attorney, Agent, or Firm* — Harness, Dickey & Pierce, P.L.C.

(57) ABSTRACT

A sampling method and apparatus applied to optical proximity correction of a lithography layout are provided in the present disclosure. The sampling method includes: performing wavelet decomposition to a pattern in the layout to be corrected, to acquire wavelet matrixes of different orders; and performing wavelet reconstruction according to the wavelet matrixes of the different orders for discrete sampling, wherein results of the discrete sampling are applied to simulation in the OPC. The sampling method and apparatus can improve the accuracy and efficiency of sampling of the layout to be corrected in a conventional technology.

8 Claims, 5 Drawing Sheets

(56) References Cited

U.S. PATENT DOCUMENTS

| | | | | |
|---|---|---|---|---|
| 7,352,892 B2 * | 4/2008 | Zhang | .................... | G06T 7/586 |
| | | | | 345/419 |
| 7,374,869 B2 * | 5/2008 | Kohler | ..................... | G03F 7/40 |
| | | | | 430/311 |
| 8,863,044 B1 * | 10/2014 | Casati | ................ | G06F 17/5072 |
| | | | | 716/106 |
| 2004/0184653 A1 * | 9/2004 | Baer | ................. | G01B 11/2509 |
| | | | | 382/145 |
| 2004/0265710 A1 * | 12/2004 | Kohler | .................... | G03F 7/40 |
| | | | | 430/5 |

FOREIGN PATENT DOCUMENTS

| | | |
|---|---|---|
| CN | 103163728 A | 6/2013 |
| JP | 2004343100 A | 12/2004 |

OTHER PUBLICATIONS

Optical Lithography—Transform, Rance Rodrigues, Feb. 2014, pp. 1-56.*

First Chinese Office Action regarding Application No. 201610843995.7 dated Jul. 4, 2017. English translation provided by http://globaldossier.uspto.gov.

* cited by examiner

| +1 | +1 |
|----|----|
| +1 | +1 |

Ψ(1,1)

| +1 | -1 |
|----|----|
| +1 | -1 |

Ψ(1,0)

| -1 | -1 |
|----|----|
| +1 | +1 |

Ψ(0,1)

| -1 | +1 |
|----|----|
| +1 | -1 |

Ψ(1,1)

SAMPLING METHOD AND APPARATUS APPLIED TO OPC OF LITHOGRAPHY LAYOUT

CROSS-REFERENCE TO RELATED APPLICATIONS

This application claims the benefit of priority to Chinese Patent Application No. 201610843995.7, titled "SAMPLING METHOD AND APPARATUS APPLIED TO OPC OF LITHOGRAPHY LAYOUT", filed on Sep. 22, 2016, the entire disclosure of which are incorporated herein by reference.

TECHNICAL FIELD

The disclosure generally relates to image processing field, and more particularly, to a sampling method and a sampling apparatus for optical proximity correction of a lithography layout.

BACKGROUND

With the integration of integrated circuits increasing, the manufacturing techniques of the integrated circuits continually develop to smaller critical dimension (CD). However, photolithography process has become a critical bottleneck in limiting the development of integrated circuits to smaller CD. The main principle of the photolithography process is to project a designed layout of an integrated circuit on a mask onto a wafer through light source. However, with the decreasing of CD, optical distortion and abnormal shape of an image projected on the wafer make it difficult to achieve a desired CD of a projected pattern with small CD, thus yield of the photolithography process is affected. Optical proximity correction (OPC) is applied to compensate for these deformations, so that the image finally projected on the wafer can get a better CD control.

Performing OPC to a layout is based on sampling of the layout, so that discrete sampling results can be acquired. The sampling quality of the layout to be corrected has a direct impact on the OPC result.

However, accuracy and efficiency of sampling of a layout to be corrected in a conventional technology needs to be improved.

SUMMARY

The technical problem solved by the present disclosure is to improve the accuracy and efficiency of sampling of a layout to be corrected in the conventional technology.

In order to solve the above technical problem, a sampling method applied to OPC of a lithography layout is provided according to an embodiment of the present disclosure. The sampling method includes: performing wavelet decomposition to a pattern in the layout to be corrected, to acquire wavelet matrixes of different orders; and performing wavelet reconstruction according to the wavelet matrixes of the different orders for discrete sampling, wherein results of the discrete sampling are applied to simulation in the OPC.

In some embodiments, performing the wavelet decomposition to the pattern in the layout to be corrected, to acquire the wavelet matrixes of the different orders includes: establishing sampling grid lines covering sampling area of the layout to be corrected, wherein a density of the sampling grid lines is determined by a wavelet order of a target order, wherein the target order is determined in accordance with sampling precision; traversing boundaries of the pattern with wavelet bases of the target order to establish an index of correlated wavelets, wherein the index of the correlated wavelets includes subblocks of the wavelet bases of the different orders that intersect with the boundaries of the pattern; and calculating the wavelet matrixes of the different orders according to the subblocks of the wavelet bases of the different orders.

In some embodiments, calculating the wavelet matrixes of the different orders according to the subblocks of the wavelet bases of the different orders includes: for each order of the different orders, taking area integrals of areas surrounded by the pattern and subblocks of the wavelet bases included in the index respectively, so that the area integrals can serve as values in the wavelet matrixes.

In some embodiments, taking the area integrals of the areas surrounded by the pattern and the subblocks of the wavelet bases included in the index respectively includes: taking the area integrals of vector functions in the area, wherein divergence of the vector functions are the wavelet bases.

In some embodiments, the boundaries of the pattern are straight lines, and the wavelet bases are Haar wavelet orthogonal bases; and the area integrals of vector functions in the areas is taken in the following way: calculating quadric forms of coordinates of endpoints in the areas; wherein the endpoints include: vertexes of the pattern in the subblocks, and intersections of the pattern and the subblocks.

A sampling apparatus applied to OPC of a lithography layout is also provided according to an embodiment of the present disclosure. The sampling apparatus includes: a wavelet decomposition unit, configured to perform wavelet decomposition to a pattern in the layout to be corrected, to acquire wavelet matrixes of different orders; and a reconstruction unit, configured to perform wavelet reconstruction according to the wavelet matrixes of the different orders for discrete sampling, wherein results of the discrete sampling are applied to simulation in the OPC.

In some embodiments, the wavelet decomposition unit includes: a grid lines establishing unit, configured to establish sampling grid lines covering sampling area of the layout to be corrected, wherein a density of the sampling grid lines is determined by a wavelet order of a target order, wherein the target order is determined in accordance with sampling precision; an index establishing unit, configured to traverse boundaries of the pattern with wavelet bases of the target order to establish an index of correlated wavelets, wherein the index of the correlated wavelets includes subblocks of wavelet bases of the different orders intersecting with the boundaries of the pattern; and a wavelet matrixes calculating unit, configured to calculate the wavelet matrixes of the different orders according to the subblocks of the wavelet bases of the different orders.

In some embodiments, the wavelet matrix calculating unit includes an integral unit, configured to, for each order of the different orders, take area integrals of areas surrounded by the pattern and subblocks of the wavelet bases included in the index respectively, so that the area integrals can serve as values in the wavelet matrixes.

In some embodiments, the integral unit is configured to take the area integrals of vector functions in the area, wherein divergence of the vector functions are the wavelet bases.

In some embodiments, the boundaries of the pattern are straight lines, and the wavelet bases are Haar wavelet orthogonal bases; the integral unit is configured to take the area integrals of vector functions in the areas in the following way: calculating quadric forms of coordinates of endpoints in the areas; wherein the endpoints include: vertexes of the pattern in the subblocks, and intersections of the pattern and the subblocks.

Compared with the conventional technology, the present disclosure has the following advantages:

the wavelet matrixes with the different orders can be acquired by performing the wavelet decomposition to the layout to be corrected, and the discrete sampling can be accomplished by performing the wavelet reconstruction according to the wavelet matrixes of the different orders; the precision of sampling can be controlled by the order of the wavelet, in order to realize a precision control of the discrete sampling results; in the wavelet matrixes of the different orders, only the values corresponding to the intersections of the wavelet matrixes and the pattern in the layout to be corrected need to be calculated, so that the computation amount in the discrete sampling process can be reduced; therefore, the discrete sampling results acquired by the wavelet decomposition and reconstruction are more accurate, compared with a method of establishing the grid lines directly on the layout to be corrected with only two results for each grid, namely being covered with pattern or not, and are also more efficient and less computational compared with a method of taking area integrals of patterns in each grid.

Further, the density of the sampling grid lines is determined by the wavelet order of the target order, and the index of the correlated wavelets can be established after traversing the pattern with the wavelet basis of the target order, wherein the index includes the subblocks of wavelet bases of the different orders intersecting with the boundaries of the pattern, and then the wavelet matrixes of the different orders can be obtained only by a calculation on the subblocks of the wavelet bases intersecting with the boundaries of the pattern, thus the computation amount can be reduced on the basis of guaranteeing the discrete sampling results.

Further, since the divergence of the vector functions are the wavelet bases, the results of the area integrals of the vector functions in the areas are constants, and the results of the area integrals can be obtained only by calculating the quadratic forms of the endpoints in the subblocks, namely, only by calculating the quadratic forms of the vertexes of the pattern in the subblocks and the quadratic forms of the intersections of the pattern and the subblocks. Therefore, the calculation amount becomes less and the calculation efficiency can be further improved.

In addition, the boundaries of the layout to be corrected are usually straight lines, as such the Haar wavelet orthogonal bases can be selected as the wavelet bases, thus the calculation amount are further reduced.

DETAILED DESCRIPTION

As described above, accuracy and efficiency of sampling of a layout to be corrected in the conventional technology remains to be improved.

Figure 1:
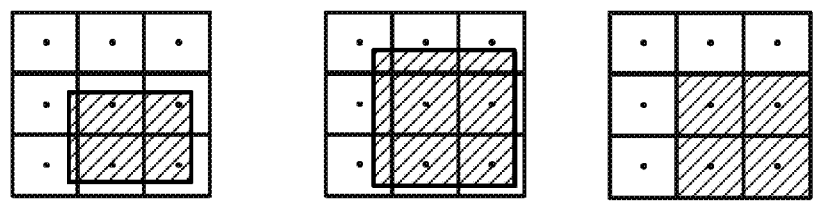
FIG. 1 schematically illustrates sampling of a layout to be corrected in a conventional technology.

FIG. 1 schematically illustrates sampling of a layout to be corrected in a conventional technology. It is usually determined by a principle of center point coverage in the conventional technology, that is, if a center of a sampling grid formed by sampling grid lines is covered by a pattern in the layout, it is 1, otherwise it is 0.

However, the inventors have found that the accuracy of the sampling method is not sufficient for OPC. For example, a sampling result of the left pattern is the same as a sampling result of the middle pattern in FIG. 1, both of which are the shaded pattern in the right side.

In order to make the accuracy of the sampling meet requirements of OPC, pattern area in each sampling grid can be sampled to acquire a correlated value corresponding to the coverage of pattern in each sampling grid. However, this method is computationally expensive and inefficient.

According to an embodiment of the present disclosure, the wavelet matrixes with the different orders can be acquired by performing the wavelet decomposition to the layout to be corrected, and the discrete sampling can be accomplished by performing the wavelet reconstruction according to the wavelet matrixes of the different orders; the precision of sampling can be controlled by the order of the wavelet, in order to realize a precision control of the discrete sampling results; in the wavelet matrixes of the different orders, only the values corresponding to the intersection of the wavelet matrixes and the pattern in the layout to be corrected need to be calculated, so that the computation amount in the discrete sampling process can be reduced; therefore, the discrete sampling results acquired by the wavelet decomposition and reconstruction are more accurate, compared with a method of establishing the grid lines directly on the layout to be corrected, with only two results for each grid, namely being covered with pattern or not, and are also more efficient and less computational compared with a method of taking area integrals of patterns in each grid.

In order that the above objects, features and advantages of the present disclosure will become more apparent, specific embodiments of the present invention will be described in detail with reference to the accompanying drawings.

Figure 2:
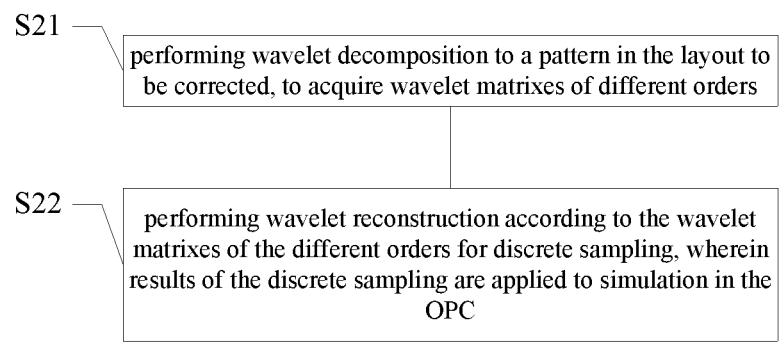
FIG. 2 schematically illustrates a flow chart of a sampling method applied to OPC of a lithography layout according to an embodiment of the present disclosure.

FIG. 2 schematically illustrates a flow chart of a sampling method applied to OPC of a lithography layout according to an embodiment of the present disclosure. The sampling method includes step S21 and step S22:

in the step S21, performing wavelet decomposition to a pattern in the layout to be corrected, to acquire wavelet matrixes with different orders; and in the step S22, performing wavelet reconstruction according to the wavelet matrixes of the different orders for discrete sampling, wherein results of the discrete sampling are applied to simulation in the OPC.

Wherein the results of the discrete sampling can be applied to fast Fourier transform (FFT) in the OPC to perform the simulation.

Specifically, the layout to be corrected may be one sampling area or a plurality of partitioned sampling areas, for example, a plurality of sampling areas partitioned according to sampling rate and wavelet order.

According to an embodiment of the present disclosure, the wavelet order can be set in accordance with precision requirement, the wavelet order is expanded in terms of the power of 2, and the higher the wavelet order is, the greater the sampling precision is. For example, when a sampling interval is 30 nm, a 10-order wavelet can sample an area of about 30 μm*30 μm, wherein 30*$2^{10}$ nm=30 μm.

When an area to be sampled in the layout to be corrected is larger than 30 μm*30 μm, the area to be sampled can be partitioned, and a multi-CPU can be used to perform the discrete sampling in parallel to each of the partitioned sampling area.

Figure 3:
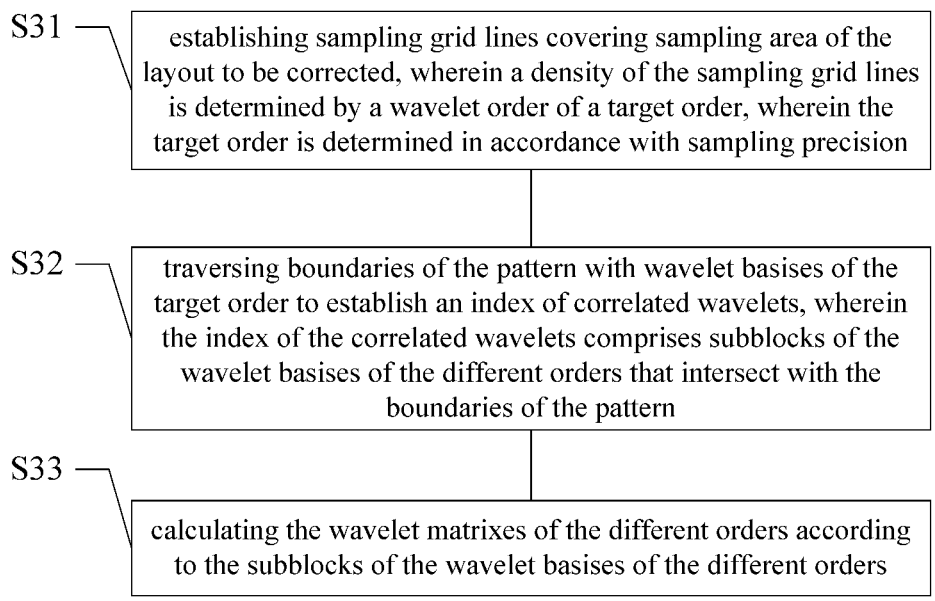
FIG. 3 schematically illustrates a detailed flow chart of step S21 in FIG. 2.

In some embodiments, referring to FIG. 3, the step S21 in FIG. 2 may includes:

step S31, establishing sampling grid lines covering sampling areas of the layout to be corrected, wherein a density of the sampling grid lines is determined by a wavelet order of a target order, wherein the target order is determined in accordance with sampling precision;

step S32, traversing boundaries of the pattern with wavelet bases of the target order to establish an index of correlated wavelets, wherein the index of the correlated wavelets includes subblocks of the wavelet bases of the different orders that intersect with the boundaries of the pattern; and step S33, calculating the wavelet matrixes of the different orders according to the subblocks of the wavelet bases of the different orders.

As described above, the wavelet order can be set in accordance with the precision requirement, and the target order is a highest order set according to the precision requirement. For example, in the aforementioned embodiments, the target order is 10-order, and an area of a sampling grid enclosed by the sampling grid lines is the same as an area of each of the subblocks in wavelet bases of the 10-order wavelet, when establishing the sampling grid lines.

In some embodiments, it is usually possible to obtain pattern positions in the layout to be corrected. Therefore, boundaries of one or more patterns in the layout to be corrected can be traversed by using the wavelet bases of the target order to establish an index of correlated wavelets.

Since the traversal is performed by using the wavelet of the target order, it is possible to calculate subblocks of wavelet bases of each order of the different orders smaller than the target order that intersect with the boundaries of the pattern, from subblocks of the wavelet bases of the target order that intersect with the pattern. Therefore, the index may include the subblocks of the wavelet bases of the different orders that intersect with the boundaries of the pattern in the layout to be corrected, and in the subsequent processes, only the subblocks of the wavelet bases that intersect with the pattern boundaries need to be further calculated, to obtain the wavelet matrixes of the different orders. Consequently, the computation amount can be further reduced on the basis of guaranteeing the discrete sampling results.

In one embodiment of the present disclosure, traversing the boundaries of the pattern may be performed by scanning the boundaries of the pattern in a clockwise or a counter-clockwise manner.

In some embodiments, the process of establishing the index of the correlated wavelets may be a process of deleting the wavelet basis functions (also referred to as wavelet bases), because expanded basis functions of the wavelet is not zero only at boundaries of the pattern, and only the wavelet basis functions at the pattern boundaries may be reserved.

Therefore, the index of the correlated wavelets including the subblocks of the wavelet bases of the different orders that intersect with the boundaries of the pattern, may specifically include intersection positions of the pattern boundaries and the subblocks of the wavelet bases of the different orders, so that the wavelet matrixes of the different orders can be calculated in the step S33.

In some embodiments, the step S33 may be performed in the following way: for each order of the different orders, taking area integrals of areas surrounded by the pattern and subblocks of the wavelet bases included in the index respectively, so that the area integrals can serve as values in the wavelet matrixes.

It can be seen from above that, the results obtained by the wavelet decomposition and reconstruction are similar to results obtained in the conventional technology by taking an area integral of each sampling grid, with high accuracy. At the same time, by establishing the wavelet index, only the subblocks of the wavelet basis of each order where the boundaries of the pattern locate are integrated and calculated, thus the calculation amount is small and the efficiency is high.

As described above, the index of the correlated wavelets may include the intersection positions of the pattern boundaries and the subblocks of the wavelet bases of the different orders. Therefore, when the above-mentioned integral calculations are performed to the subblocks of the wavelet bases of the different orders, the results generated in the step S31 can be utilized, and then the utilization ratio of known data can be increased, and the calculation efficiency can be further improved.

In a non-limiting embodiment, taking the area integrals of the areas surrounded by the pattern and the subblocks of the wavelet bases included in the index can be realized in the following way: taking the area integrals of vector functions in the area, wherein divergence of the vector functions are the wavelet bases.

Since the divergence of the vector functions are the wavelet bases, the results are constants when taking the area integrals of the vector functions in the areas, and only quadratic forms of endpoints in the subblocks are calculated, namely, only quadratic forms of vertexes of the pattern in the subblocks and quadratic forms of intersections of the pattern and the subblocks need to be calculated to obtain results of the area integrals. Thus the calculation amount is small and the calculation efficiency can be further improved.

In some embodiments, when the boundaries of the pattern in the layout to be corrected are straight lines, the wavelet bases may be Haar wavelet orthogonal bases. The area integrals of the vector functions in the areas may be taken in the following way: calculating quadratic forms of coordinates of endpoints in the areas; wherein the endpoints includes vertexes of the pattern in the subblocks, and intersections of the pattern and the subblocks.

Figures 4, 5:
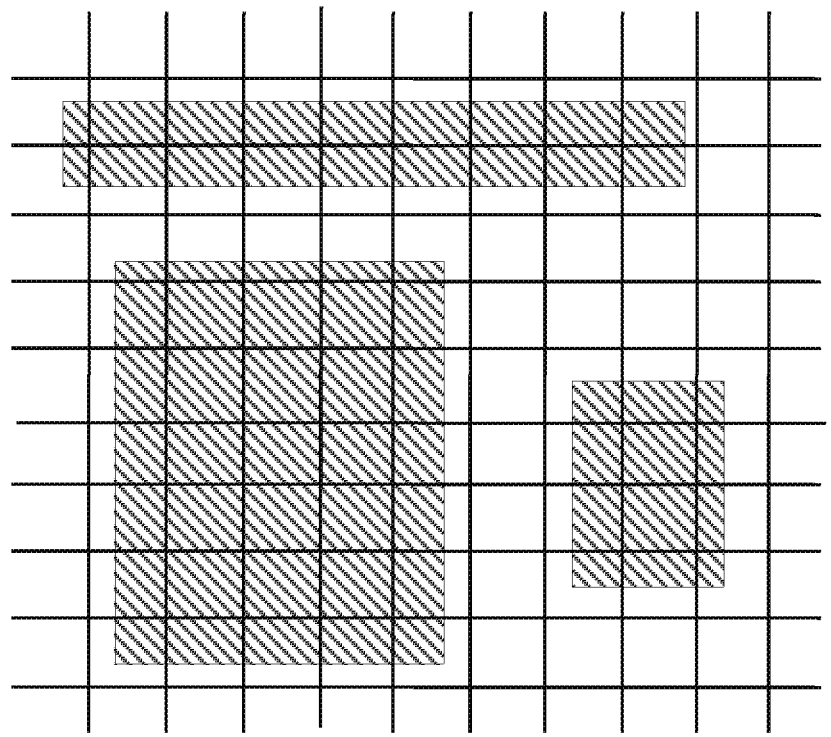
FIG. 4 schematically illustrates a layout to be corrected in which pattern boundaries are straight lines and sampling grid lines according to an embodiment of the present disclosure.
FIG. 5 schematically illustrates a set of two-dimensional Haar wavelet orthogonal basis functions according to an embodiment of the present disclosure.
Figure 6:
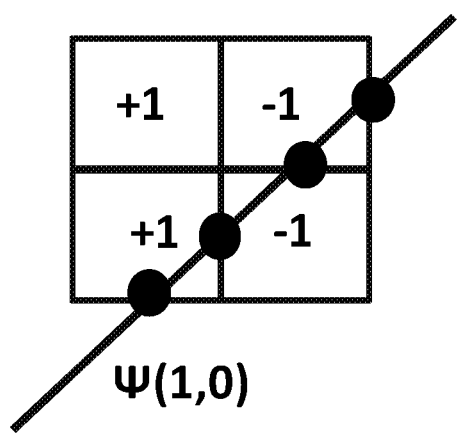
FIG. 6 schematically illustrates intersections of a pattern boundary and four subblocks of a wavelet basis according to an embodiment of the present disclosure.

FIG. 4 schematically illustrates a layout to be corrected in which boundaries of pattern are straight lines and sampling grid lines according to an embodiment of the present invention. It can be seen that, there are three patterns, boundaries of each pattern are straight lines. Haar wavelet orthogonal bases can be adopted to perform the wavelet decomposition and reconstruction to each pattern. FIG. 5 schematically illustrates a set of two dimensional Haar wavelet orthogonal basis functions, including ψ(0, 0), ψ(1, 0), ψ(0, 1) and ψ(1, 1) respectively. Wherein ψ(1, 0), ψ(0, 1) and ψ(1, 1) are basis functions of a wavelet of two order. FIG. 6 schematically illustrates intersections of a pattern boundary and four subblocks of a wavelet basis.

Taking basis functions of the two-dimensional Haar wavelet orthogonal basis functions as an example, the area integrals of the vector functions in the area can be taken by the following steps:

First, converting an area integral to a curve integral along a boundary according to Green's formula:

$$\int\int_M \nabla F d\xi = \int_{\partial M} F*n(\rho) d\rho;$$

wherein M is an area surrounded by the subblocks of the wavelet bases of the pattern; selecting a suitable F to satisfy the equation of ∇F=ψ, since the subblocks of ψ function are constants (+1 or −1), the vector function F is a linear function; ξ is area infinitesimal; ∂M are boundaries of M; ρ is curve infinitesimal; n(ρ) is a normal direction of the curve infinitesimal.

Figure 7:
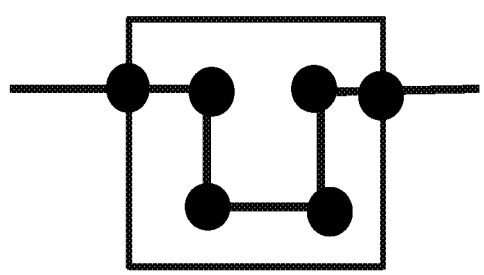
FIG. 7 schematically illustrates endpoints according to an embodiment of the present disclosure.

Since the boundaries of each pattern are straight lines, quadratic forms of endpoints coordinates can be used to identify the integral function. Therefore, only vertex values included in the subblocks and intersection values of the subblocks and the pattern need to be calculated. For example, in FIG. 7, only locations of the six endpoints needs to be calculated.

According to embodiments of the present disclosure, the wavelet matrixes with the different orders can be acquired by performing the wavelet decomposition to the layout to be corrected, and the discrete sampling can be accomplished by performing the wavelet reconstruction according to the wavelet matrixes of the different orders; the precision of sampling can be controlled by the order of the wavelet, in order to realize a precision control of the discrete sampling results; in the wavelet matrixes of the different orders, only the values corresponding to the intersections of the wavelet matrixes and the pattern in the layout to be corrected need to be calculated, so that the computation amount in the discrete sampling process can be reduced; therefore, the discrete sampling results acquired by the wavelet decomposition and reconstruction are more accurate, compared with a method of establishing the grid lines directly on the layout to be corrected, with only two results for each grid, namely being covered with pattern or not, and are also more efficient and less computational compared with a method of taking area integrals of patterns in each grid.

Figure 8:
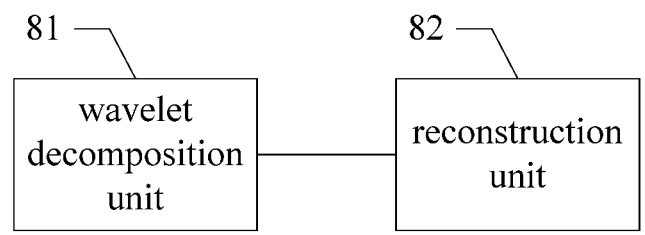
FIG. 8 schematically illustrates a structural diagram of a sampling apparatus applied to OPC of a lithography layout according to an embodiment of the present disclosure.

A sampling apparatus applied to OPC of a lithography layout is also provided according to an embodiment of the present disclosure. FIG. 8 schematically illustrates a structural diagram of the sampling apparatus.

The sampling apparatus applied to the OPC of the lithography layout may include:

a wavelet decomposition unit 81, configured to perform wavelet decomposition to a pattern in the layout to be corrected, to acquire wavelet matrixes of different orders; and a reconstruction unit 82, configured to perform wavelet reconstruction according to the wavelet matrixes of the different orders for discrete sampling, wherein results of the discrete sampling are applied to simulation in the OPC.

In some embodiments, the wavelet decomposition unit 81 may include:

a grid lines establishing unit (not shown), configured to establish sampling grid lines covering sampling area of the layout to be corrected, wherein a density of the sampling grid lines is determined by a wavelet order of a target order, wherein the target order is determined in accordance with sampling precision;

an index establishing unit (not shown), configured to traverse boundaries of the pattern with wavelet bases of the target order to establish an index of correlated wavelets, wherein the index of the correlated wavelets includes subblocks of wavelet bases of the different orders intersecting with the boundaries of the pattern; and a wavelet matrixes calculating unit (not shown), configured to calculate the wavelet matrixes of the different orders according to the subblocks of the wavelet bases of the different orders.

In some embodiments, the wavelet matrixes calculating unit may include an integral unit (not shown), configured to for each order of the different orders, take area integrals of areas surrounded by the pattern and subblocks of the wavelet bases included in the index respectively, so that the area integrals can serve as values in the wavelet matrixes.

In some embodiments, the integral unit is configured to take the area integrals of vector functions in the area, wherein divergence of the vector functions are the wavelet bases.

In some embodiments, the boundaries of the pattern are straight lines, and the wavelet bases are Haar wavelet orthogonal bases; the integral unit is configured to take the area integrals of vector functions in the areas in the following way: calculating quadric forms of coordinates of endpoints in the areas; wherein the endpoints include vertexes of the pattern in the subblocks and intersections of the pattern and the subblocks.

The specific implementations and advantages of the sampling apparatus applied to OPC of the lithography layout in embodiments of the present disclosure can refer to the sampling method applied to OPC of the lithography layout, which will not be described herein.

It will be appreciated by those of ordinary skill in the art that all or a portion of the steps in the various methods of the embodiments described above may be performed by a program that instructs the associated hardware to be stored in a computer-readable storage medium which may include: ROM, RAM, magnetic disk, or optical disk.

Although the present invention has been described above, the present invention is not limited thereto. It should be understood by those skilled in the art that various changes and modifications may be made without departing from the spirit and scope of the invention, and it is therefore intended that the scope of protection of the invention be defined by the claims.

What is claimed is:

1. A sampling method applied to optical proximity correction (OPC) of a lithography layout, comprising:
  performing wavelet decomposition to a pattern in the layout to be corrected, to acquire wavelet matrixes of different orders, wherein performing the wavelet decomposition to the pattern in the layout to be corrected, to acquire the wavelet matrixes of the different orders comprises: establishing sampling grid lines covering sampling area of the layout to be corrected, wherein a density of the sampling grid lines is determined by a wavelet order of a target order, wherein the target order is determined in accordance with sampling precision; traversing boundaries of the pattern with wavelet bases of the target order to establish an index of correlated wavelets, wherein the index of the correlated wavelets comprises subblocks of the wavelet bases of the different orders that intersect with the boundaries of the pattern; and calculating the wavelet matrixes of the different orders according to the subblocks of the wavelet bases of the different orders; and performing wavelet reconstruction according to the wavelet matrixes of the different orders for discrete sampling, wherein results of the discrete sampling are applied to simulation in the OPC.

2. The sampling method applied to the OPC of the lithography layout according to claim 1, characterized in that, calculating the wavelet matrixes of the different orders according to the subblocks of the wavelet bases of the different orders comprises: for each order of the different orders, taking area integrals of areas surrounded by the pattern and subblocks of the wavelet bases comprised in the index respectively, so that the area integrals can serve as values in the wavelet matrixes.

3. The sampling method applied to the OPC of the lithography layout according to claim 2, characterized in that, taking the area integrals of the areas surrounded by the pattern and the subblocks of the wavelet bases comprised in the index respectively comprises: taking the area integrals of vector functions in the area, wherein divergence of the vector functions are the wavelet bases.

4. The sampling method applied to the OPC of the lithography layout according to claim 3, characterized in that, the boundaries of the pattern are straight lines, and the wavelet bases are Haar wavelet orthogonal bases; and the area integrals of vector functions in the areas is taken in the following way: calculating quadric forms of coordinates of endpoints in the areas; wherein the endpoints comprise: vertexes of the pattern in the subblocks, and intersections of the pattern and the subblocks.

5. A sampling apparatus applied to optical proximity correction (OPC) of a lithography layout, comprising:

a wavelet decomposition unit, configured to perform wavelet decomposition to a pattern in the layout to be corrected, to acquire wavelet matrixes of different orders, wherein the wavelet decomposition unit comprises: a grid lines establishing unit, configured to establish sampling grid lines covering sampling area of the layout to be corrected, wherein a density of the sampling grid lines is determined by a wavelet order of a target order, wherein the target order is determined in accordance with sampling precision; an index establishing unit, configured to traverse boundaries of the pattern with wavelet bases of the target order to establish an index of correlated wavelets, wherein the index of the correlated wavelets comprises subblocks of wavelet bases of the different orders intersecting with the boundaries of the pattern; and a wavelet matrixes calculating unit, configured to calculate the wavelet matrixes of the different orders according to the subblocks of the wavelet bases of the different orders; and a reconstruction unit, configured to perform wavelet reconstruction according to the wavelet matrixes of the different orders for discrete sampling, wherein results of the discrete sampling are applied to simulation in the OPC.

6. The sampling apparatus applied to the OPC of the lithography layout according to claim 5, characterized in that, the wavelet matrix calculating unit comprises an integral unit, configured to, for each order of the different orders, take area integrals of areas surrounded by the pattern and subblocks of the wavelet bases comprised in the index respectively, so that the area integrals can serve as values in the wavelet matrixes.

7. The sampling apparatus applied to the OPC of the lithography layout according to claim 6, characterized in that, the integral unit is configured to take the area integrals of vector functions in the area, wherein divergence of the vector functions are the wavelet bases.

8. The sampling apparatus applied to the OPC of the lithography layout according to claim 7, characterized in that, the boundaries of the pattern are straight lines, and the wavelet bases are Haar wavelet orthogonal bases;

the integral unit is configured to take the area integrals of vector functions in the areas in the following way: calculating quadric forms of coordinates of endpoints in the areas; wherein the endpoints comprise: vertexes of the pattern in the subblocks, and intersections of the pattern and the subblocks.

* * * * *